United States Patent
Jung

(10) Patent No.: US 12,074,392 B2
(45) Date of Patent: Aug. 27, 2024

(54) FPCB ASSEMBLY FOR BATTERY MODULE, ITS MANUFACTURING METHOD, AND BATTERY MODULE INCLUDING THE SAME

(71) Applicant: LG Chem, Ltd., Seoul (KR)

(72) Inventor: Sang-Eun Jung, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 16/768,996

(22) PCT Filed: Oct. 18, 2019

(86) PCT No.: PCT/KR2019/013752
§ 371 (c)(1),
(2) Date: Jun. 2, 2020

(87) PCT Pub. No.: WO2020/122404
PCT Pub. Date: Jun. 18, 2020

(65) Prior Publication Data
US 2021/0184379 A1    Jun. 17, 2021

(30) Foreign Application Priority Data
Dec. 11, 2018   (KR) .......................... 10-2018-0159520

(51) Int. Cl.
*H01R 12/78*   (2011.01)
*H01M 10/48*   (2006.01)
(Continued)

(52) U.S. Cl.
CPC ............ *H01R 12/78* (2013.01); *H01M 10/48* (2013.01); *H01R 12/777* (2013.01);
(Continued)

(58) Field of Classification Search
None
See application file for complete search history.

(56) References Cited

U.S. PATENT DOCUMENTS

| | | | |
|---|---|---|---|
| 5,993,247 A * | 11/1999 | Kidd | H01R 12/592 439/495 |
| 6,830,484 B1 * | 12/2004 | Lee | H04Q 1/142 439/640 |
| 9,490,566 B2 * | 11/2016 | Higgy | H01R 43/16 |

(Continued)

FOREIGN PATENT DOCUMENTS

| | | |
|---|---|---|
| CN | 101552330 A | 10/2009 |
| DE | 10209648 A1 | 10/2003 |

(Continued)

OTHER PUBLICATIONS

Extended European Search Report including Written Opinion for Application No. 19897226.7 dated Mar. 26, 2021, 7 pages.

(Continued)

*Primary Examiner* — Felix O Figueroa
(74) *Attorney, Agent, or Firm* — Lerner David LLP

(57) ABSTRACT

A flexible printed circuit board (FPCB) assembly for a battery module includes a insulated flexible film and conductor patterns arranged inside the film in a predetermined form, and the conductor patterns transmit an electric signal. The FPCB assembly includes a main FPCB configured to extend in one direction; and a sub FPCB assembled to at least one side of the main FPCB and configured to extend in a direction different from the main FPCB.

9 Claims, 6 Drawing Sheets

(51) Int. Cl.
  *H01R 12/77* (2011.01)
  *H01R 13/66* (2006.01)
  *H01R 43/20* (2006.01)
  *H05K 1/02* (2006.01)
  *H05K 1/14* (2006.01)
(52) U.S. Cl.
  CPC ....... *H01R 12/778* (2013.01); *H01R 13/6683* (2013.01); *H01R 43/205* (2013.01); *H05K 1/0277* (2013.01); *H05K 1/14* (2013.01); *H05K 2201/10037* (2013.01); *H05K 2201/10795* (2013.01)

(56) References Cited

U.S. PATENT DOCUMENTS

| | | | | |
|---|---|---|---|---|
| 9,515,356 | B2 * | 12/2016 | Zeng | H01M 10/482 |
| 9,812,800 | B2 * | 11/2017 | Lee | H01R 12/771 |
| 10,319,498 | B2 * | 6/2019 | Huang | H01R 12/613 |
| 10,404,081 | B2 * | 9/2019 | Ota | H02J 7/0013 |
| 10,931,047 | B2 * | 2/2021 | Lee | H01R 12/78 |
| 2009/0233465 | A1 | 9/2009 | Mizoguchi | |
| 2009/0246627 | A1 | 10/2009 | Park | |
| 2010/0136422 | A1 | 6/2010 | Koh et al. | |
| 2011/0003622 | A1 | 1/2011 | Hwang | |
| 2012/0148876 | A1 | 6/2012 | Zeng et al. | |
| 2012/0223659 | A1 | 9/2012 | Kang et al. | |
| 2013/0266823 | A1 | 10/2013 | Lee | |
| 2018/0053981 | A1 | 2/2018 | Bae et al. | |
| 2020/0014005 | A1 | 1/2020 | Lee et al. | |

FOREIGN PATENT DOCUMENTS

| | | | |
|---|---|---|---|
| JP | 2003069180 | A | 3/2003 |
| JP | 2004135012 | A | 4/2004 |
| JP | 2008226965 | A | 9/2008 |
| JP | 2013105522 | A | 5/2013 |
| JP | 2014503947 | A | 2/2014 |
| KR | 20000040676 | A | 7/2000 |
| KR | 20100063379 | A | 6/2010 |
| KR | 20110003629 | A | 1/2011 |
| KR | 20120099930 | A | 9/2012 |
| KR | 20130113975 | A | 10/2013 |
| KR | 101543041 | B1 | 8/2015 |
| KR | 20160061638 | A | 6/2016 |
| KR | 101667301 | B1 * | 10/2016 |
| KR | 101872834 | B1 | 6/2018 |
| KR | 20180099437 | A | 9/2018 |
| KR | 20180099438 | A | 9/2018 |
| KR | 20180099439 | A | 9/2018 |

OTHER PUBLICATIONS

International Search Report for Application No. PCT/KR2019/013752 mailed Jan. 30, 2020, 3 pages.

Search Report dated Sep. 26, 2023 from the Office Action for Chinese Application No. 201980021878.4 issued Sep. 29, 2023, 2 pages. [See p. 1, categorizing the cited references].

\* cited by examiner

FPCB ASSEMBLY FOR BATTERY MODULE, ITS MANUFACTURING METHOD, AND BATTERY MODULE INCLUDING THE SAME

CROSS-REFERENCE TO RELATED APPLICATIONS

The present application is a national phase entry under 35 U.S.C. § 371 of International Application No. PCT/KR2019/013752 filed Oct. 18, 2019, published in Korean, which claims priority from Korean Patent Application No. 10-2018-0159520 filed Dec. 11, 2018, all of which are incorporated herein by reference.

TECHNICAL FIELD

The present disclosure relates to a flexible printed circuit board (FPCB) used for sensing a voltage of a battery module, and more particularly, to a FPCB assembly for a battery module, which is configured by connecting several FPCBs provided in a simple form, and its manufacturing method and a battery module including the FPCB assembly.

BACKGROUND ART

Generally, a printed circuit board (PCB) is widely used for various electronic products such as TVs, computers, mobile phones, displays, communication networks, and secondary battery modules. As a kind of the PCB, in particular, a flexible printed circuit board (FPCB) having insulation and flexibility is widely used recently.

Specifically, the FPCB is prepared by laminating a dry film on a copper foil laminate in which a copper foil is formed on a polyimide film to form a conductor pattern through exposure, development and etching processes, and then bonding a coverlay film to an outermost copper foil. The FPCB is installed in a bent state inside a complex product case or used for a repeatedly moving part by utilizing the flexibility of its raw material. Due to the nature of the FPCB, the FPCB is used in various ways for miniaturization (digital cameras, camcorders, or the like), flexibility (print heads, hard disks, or the like), high density wiring (precision devices such as medical instruments), and rationalization of assembly (measuring instruments, vehicle electronics, battery modules, or the like).

A conventional battery module uses a lot of harness wire as a means for sensing a voltage of the battery cell and transmitting a signal. However, it has been repeatedly found that the harness wire causes a problem in the space inside the battery module and the contact with a connector, so the FPCB is being frequently used as an alternative thereto.

Meanwhile, the FPCB for sensing a voltage of a battery module is mainly used in a battery module configured using a pouch-type secondary battery in which a positive electrode lead and a negative electrode lead are located at opposite sides, so its shape is designed in approximately an I-type, or in an E-type or an F-type in consideration of the addition of a temperature sensor or the like.

However, if the FPCB is prepared in the I-type, the E-type or the F-type shape as above, too much scraps may remain. For example, the FPCB may be prepared by cutting or stamping a predesigned FPCB shape from a FPCB sheet having a polyamide film and a copper foil. However, as shown in FIG. 1, in an E-type FPCB 1, an unused space 3 remains too much in a FPCB sheet 2 due to its geometric shape. The unused space 3, namely the scrap, is mostly not reused and discarded. This is a major reason for the increase in the material cost of FPCB. Thus, there is a need for a method or a FPCB design to minimize an unused space in the FPCB sheet 2.

SUMMARY

Technical Problem

The present disclosure is designed to solve the problems of the related art, and therefore the present disclosure is directed to saving a material cost compared to the conventional technique by designing a FPCB to utilize the space of a FPCB sheet to the maximum.

However, the technical problem to be solved by the present disclosure is not limited to the above, and another objects not mentioned above will be clearly understood by those skilled in the art from the following description of the invention described.

Technical Solution

In one aspect of the present disclosure, there is provided a flexible printed circuit board (FPCB) assembly for a battery module, which includes an insulated flexible film, and conductor patterns arranged inside the film in a predetermined form and configured to transmit an electric signal, a main FPCB portion configured to extend longitudinally in a first direction; and a sub FPCB portion assembled to at least one side of the main FPCB portion and configured to extend longitudinally in a second direction different from the first direction.

The main FPCB portion may include first connector terminals positioned at at least one side thereof, and the sub FPCB portion may include second connector terminals positioned at a region of the sub FPCB portion that is configured to be assembled to the main FPCB, wherein the second connector terminals are configured to be fitted into the first connector terminals.

Each of the first connector terminals may be shaped as a socket-type female connector pin, and each of the second connector terminals may be shaped as a male connector pin that is inserted into the female connector pin.

The first connector terminals and the second connector terminals may be configured to be compressed when connected to each other.

A first film portion in a region of the main FPCB portion including the first connector terminals may be concave, and a second film portion in a region of the sub FPCB portion including the second connector terminals may be convex.

The main FPCB portion may include a single part, the sub FPCB portion may include multiple parts, and each part of the sub FPCB portion may be configured to be assembled with the main FPCB portion.

The sub FPCB portion may include a first sub FPCB part and a second sub FPCB part, and the first sub FPCB part and the second sub FPCB part may be respectively assembled to opposing longitudinal ends of the main FPCB portion and disposed to extend longitudinally in the second direction, wherein the second direction is not parallel to the first direction.

At least one voltage sensing terminal may be attached to each of the first sub FPCB part and the second sub FPCB part, and at least one temperature sensor may be attached to the main FPCB portion.

In another aspect of the present disclosure, there is also provided a method of manufacturing the FPCB assembly for a battery module including an insulated flexible film and conductor patterns arranged inside the film in a predetermined form and configured to transmit an electric signal. The method may include: separating a main FPCB portion of the FPCB assembly on a first FPCB sheet including a plurality of main FPCB portions from a sub FPCB portion of the FPCB assembly on a second FPCB sheet including a plurality of the sub FPCB portions; and assembling the main FPCB portion to the sub FPCB portion by connecting first connector terminals positioned at at least one side of the main FPCB portion to second connector terminals positioned at at least one side of the sub FPCB portion.

Each of the first connector terminals may be shaped as a socket-type female connector pin, and shaped as a male connector pin, and assembling the main FPCB portion to the sub FPCB portion may include inserting the second connector terminals into the first connector terminals.

Assembling the main FPCB portion to the sub FPCB portion may include compressing the first connector terminals and the second connector terminals by a clinching process after being connected to each other.

In still another aspect of the present disclosure, there is also provided a battery module, comprising the FPCB assembly for a battery module as described in any of the embodiments herein.

Advantageous Effects

According to an embodiment of the present disclosure, a FPCB assembly for a battery module having a complicated shape may be configured by connecting a plurality of FPCBs having a simple shape to each other. The FPCBs having a simple shape may be arranged in the FPCB sheet so that an unused space remains less than the conventional technique. Thus, it is possible to minimize the amount of scrap discarded after manufacturing the FPCB, thereby reducing the material cost.

According to another embodiment of the present disclosure, a FPCB assembly for a battery module having an I shape, a T shape, an E shape, an F shape, or the like may be implemented in a simpler and more economical way than the conventional technique by adopting connector pins to be fitted into unit FPCBs having approximately a straight shape.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

A FPCB assembly described below may be included in a battery module and used as a wiring component that senses a voltage and a temperature of secondary battery cells and transmits the same to a battery management system (BMS). Here, the use of the FPCB assembly according to the present disclosure is not limited as a voltage sensing component of the battery module. For example, the FPCB assembly may also be used to transmit a signal or power provided by one device or circuit board to another device or circuit board.

Figure 1:
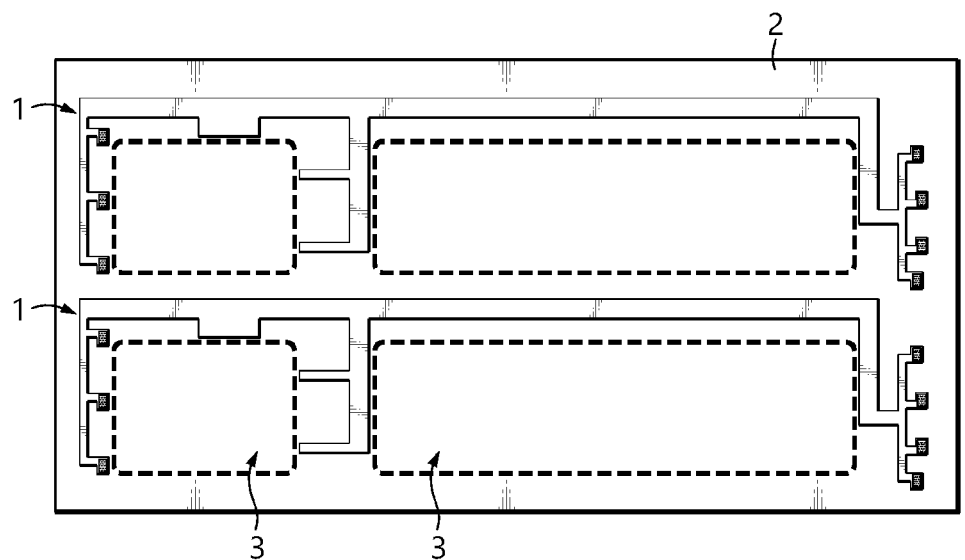
FIG. 1 is a diagram for illustrating space utilization of a FPCB sheet when a conventional FPCB for a battery module is manufactured, as a reference.
Figure 2:
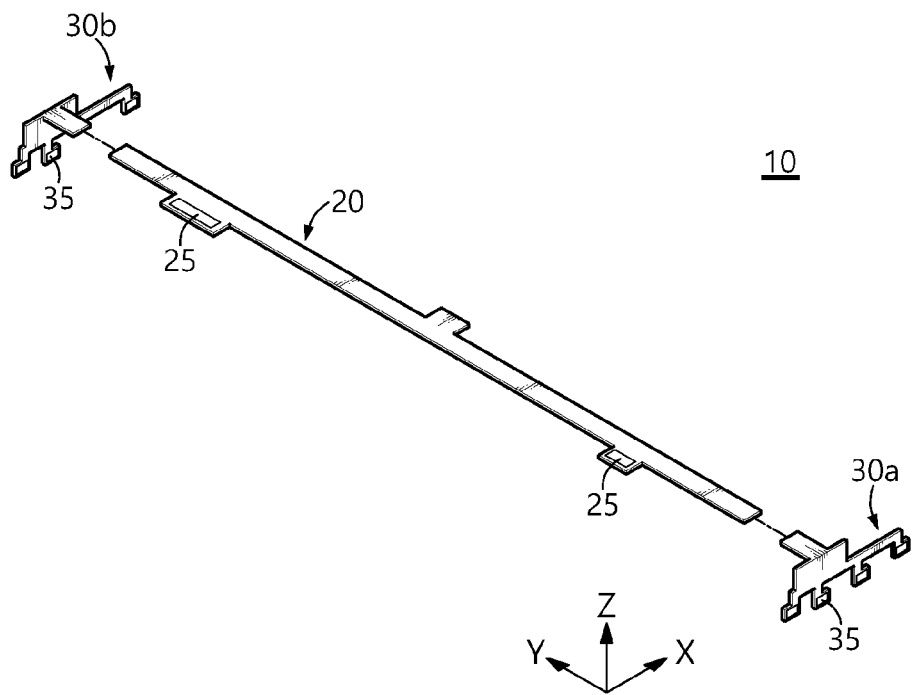
FIGS. 2 and 3 are an exploded perspective view and an assembled perspective view showing a FPCB assembly according to an embodiment of the present disclosure.
Figure 3:
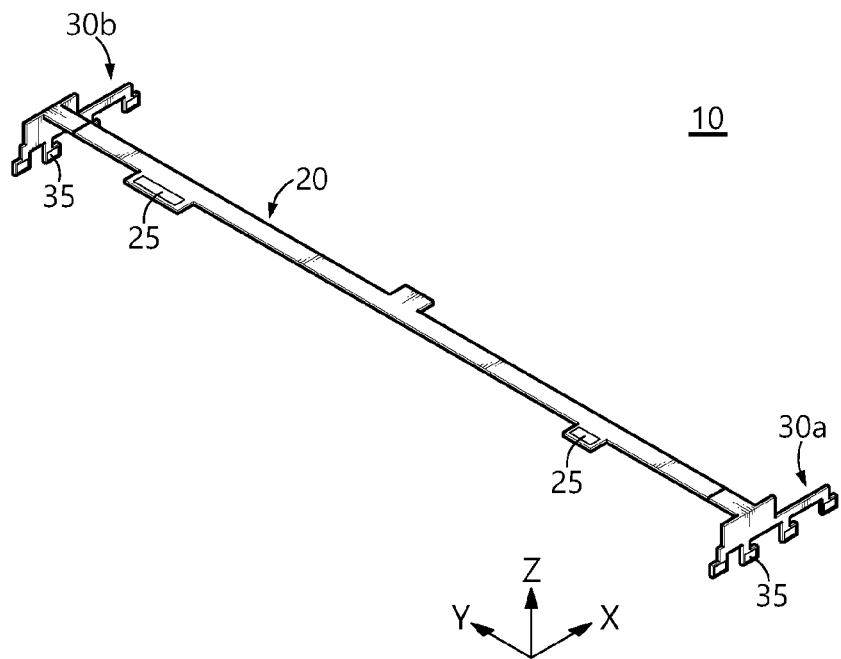

FIGS. 2 and 3 are an exploded perspective view and an assembled perspective view showing a FPCB assembly according to an embodiment of the present disclosure.

Referring to these figures, a FPCB assembly 10 for a battery module according to an embodiment of the present disclosure includes a main FPCB 20 and two sub FPCBs 30a and 30b provided to be assembled to the main FPCB 20.

The main FPCB 20 and the two sub FPCBs 30a, 30b include conductor patterns 11 for transmitting electric signals and a film for protecting the conductor patterns 11 and giving insulation and flexibility thereto, and are assembled as shown in the figures to form a single FPCB assembly 10.

The main FPCB 20 extends in one direction, and the two sub FPCBs 30a, 30b take extend in a direction different from the main FPCB 20. Referring to FIGS. 2 and 3, the main FPCB 20 is arranged to extend along a Y-axis direction and the two sub FPCBs 30a, 30b are connected to both ends of the main FPCB 20 and extend along an X-axis direction, respectively.

That is, the two sub FPCBs 30a, 30b include a first sub FPCB 30a and a second sub FPCB 30b, and the first sub FPCB 30a and the second sub FPCB 30b are respectively assembled to one longitudinal end and the other longitudinal end of the main FPCB 20 to extend in a direction that intersects the main FPCB 20.

The first sub FPCB 30a and the second sub FPCB 30b include a voltage sensing terminal 35, which is a part for sensing the voltage of the battery cells and extend in a direction different from the main FPCB 20 serving as a main wiring, and this is to improve accessibility to electrode leads of the battery cells.

Figure 4:
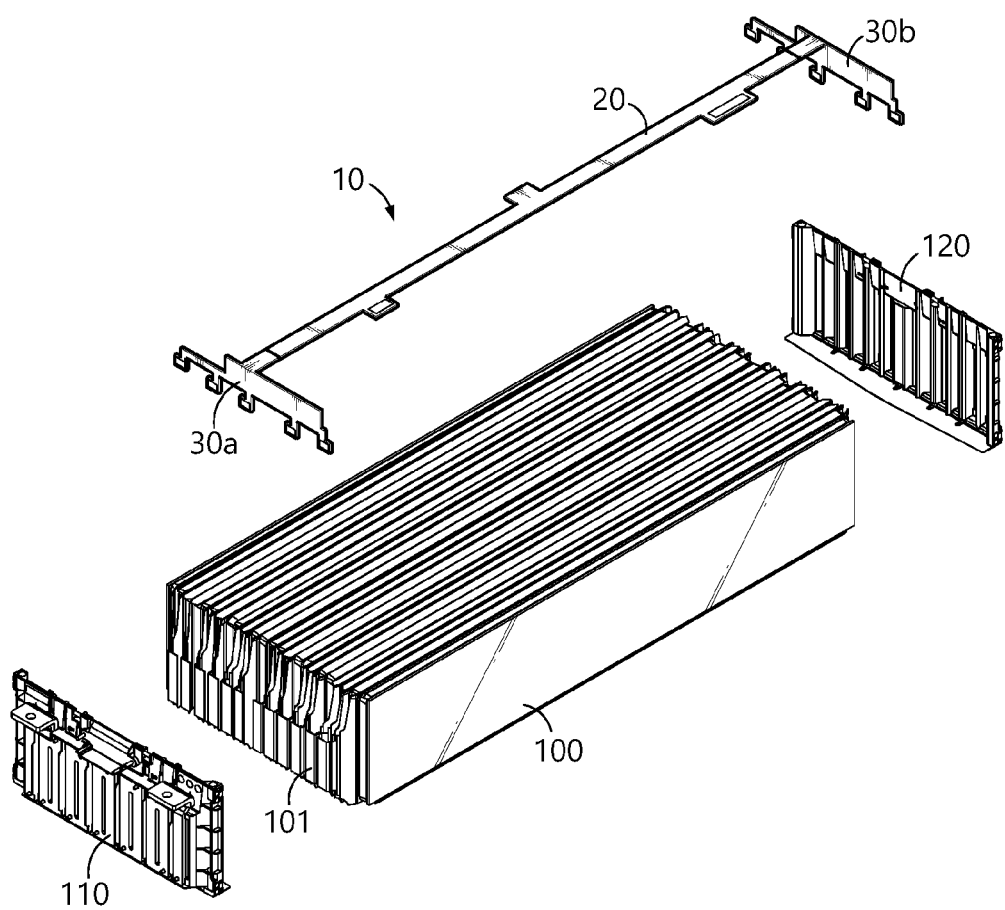
FIG. 4 a diagram for illustrating an example where the FPCB assembly for a battery module as shown in FIG. 3 is installed.

As shown in FIG. 4, the FPCB assembly 10 for a battery module may be mounted to a cell stack 100. Here, the cell stack 100 may be referred to as an aggregate of pouch-type battery cells in which the pouch-type battery cells are provided to stand erectly and stacked in one direction.

The main FPCB 20 is disposed at an upper surface of the cell stack 100 along a longitudinal direction thereof, and the first sub FPCB 30a and the second sub FPCB 30b are respectively disposed at a front surface and a rear surface of the cell stack 100 at which the electrode leads 101 are located. The electrode leads 101 of the battery cells may be welded to bus bars on integrated circuit boards (ICBs) 110, 120, and the voltage sensing terminals 35 of the first sub FPCB 30a and the second sub FPCB 30b are attached to the bus bars to sense the voltage of the battery cells.

A temperature sensor 25 is attached to the main FPCB 20 so that the temperature sensor 25 senses the temperature of the battery cells. Battery cells in operation may have a temperature difference depending on their areas, so the number and location of the temperature sensor 25 attached thereto may be differently selected as necessary.

This embodiment discloses an I-shaped or H-shaped FPCB assembly 10 in which two sub FPCBs 30a, 30b are assembled to a single main FPCB 20. However, unlike this embodiment, one sub FPCB or three or more sub FPCBs 30a, 30b may also be assembled to the main FPCB 20 to form the FPCB assembly 10 in more various shapes.

That is, the FPCB assembly 10 may be assembled such that at least one sub FPCB 30a, 30b is stretched in various directions from the single main FPCB 20.

Figure 5:
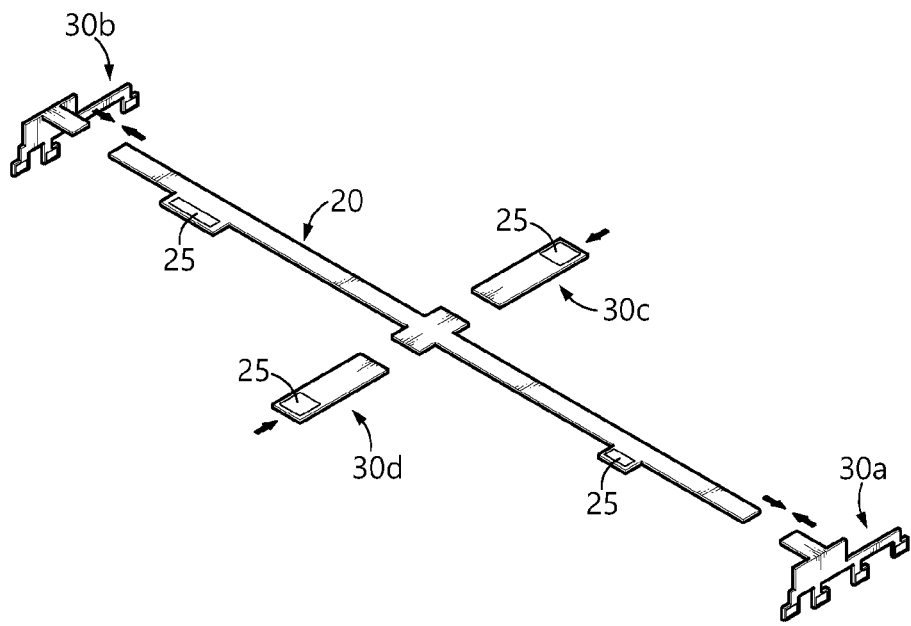
FIG. 5 is a diagram showing a modified example of the FPCB assembly according to an embodiment of the present disclosure.

For example, FIG. 5 shows a modified example of this embodiment. In the FPCB assembly 10 shown in FIG. 5, two sub FPCBs 30c, 30d are further assembled to a center region of the main FPCB 20. That is, the FPCB assembly 10 according to this modified example is configured by assembling one main FPCB 20 and four sub FPCBs 30a, 30b, 30c, 30d. The FPCB assembly 10 allows the temperature sensors 25 to be easily disposed at both edge regions of the cell stack 100 along the width direction.

Figure 6:
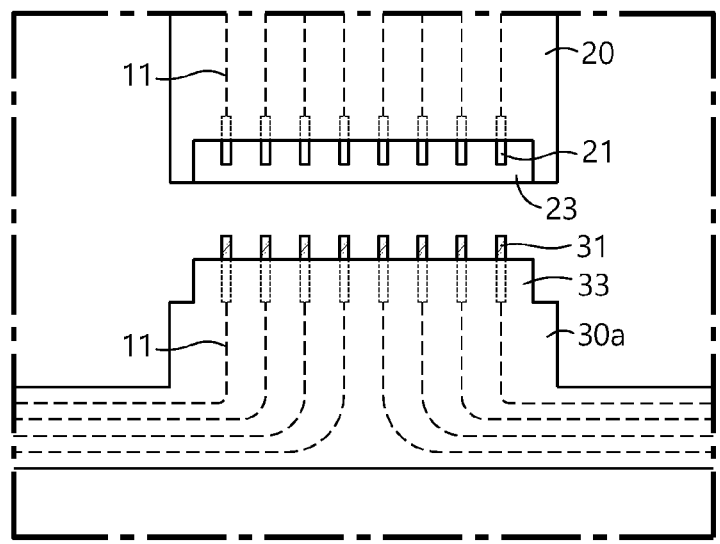
FIGS. 6 and 7 are diagrams for illustrating a connection structure of a main FPCB and a sub FPCB according to an embodiment of the present disclosure.

Subsequently, the connection structure of the main FPCB 20 and the sub FPCBs 30a, 30b will be described with reference to FIGS. 6 to 8.

In this embodiment, the connection structure of the main FPCB 20 and the sub FPCB 30a, 30b may be implemented using a connector connection method. For this purpose, as shown in FIG. 6, the main FPCB 20 has first connector terminals 21 provided to at least one side thereof, and the sub FPCBs 30a, 30b have second connector terminals 31 provided to a region assembled to the main FPCB 20. 31 and fitted into the first connector terminal 21.

Each of the first connector terminals 21 may be provided to have a shape of a socket-type female connector pin, and each of the second connector terminals 31 may be provided to have a shape of a male connector pin that may be inserted into the female connector pin.

The female connector pins and the male connector pins are connected to the conductor patterns 11 of the FPCB assembly 10 in one-to-one relationship, respectively. For example, the female connector pins and the male connector pins may be made of a conductive metal such as copper or nickel and attached to the corresponding conductor patterns 11 by shouldering or the like, respectively. In this embodiment, eight conductor patterns 11 are provided, but the number of the conductor patterns 11 may increase or decrease depending on the number of signals to be transmitted by the conductor patterns 11.

Figure 7:
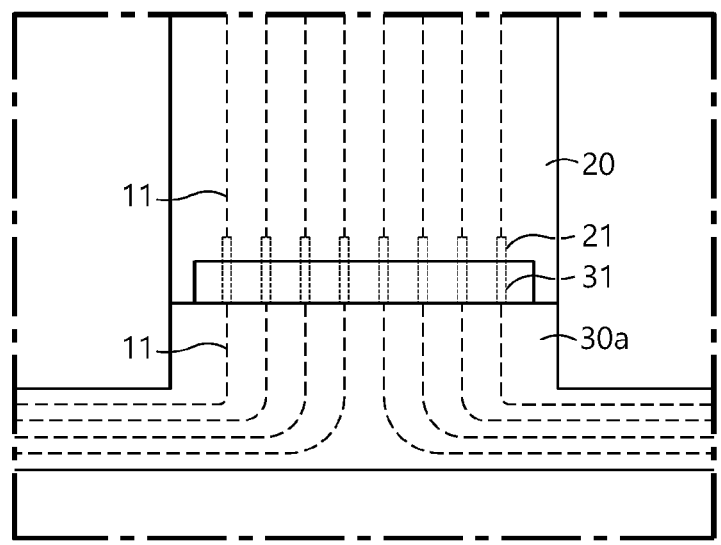

As shown in FIG. 7, the sub FPCBs 30a, 30b are connected to main FPCB 20 as the second connector terminals 31 are inserted into the first connector terminals 21 of the main FPCB 20. Of course, at this time, the conductor patterns 11 of the main FPCB 20 and the sub FPCBs 30a, 30b are also electrically connected.

In this embodiment, the first connector terminal 21 and the second connector terminal 31 may be further compressed in a clinching process to further secure the contact reliability of the first connector terminals 21 and the second connector terminals 31.

Figure 8:
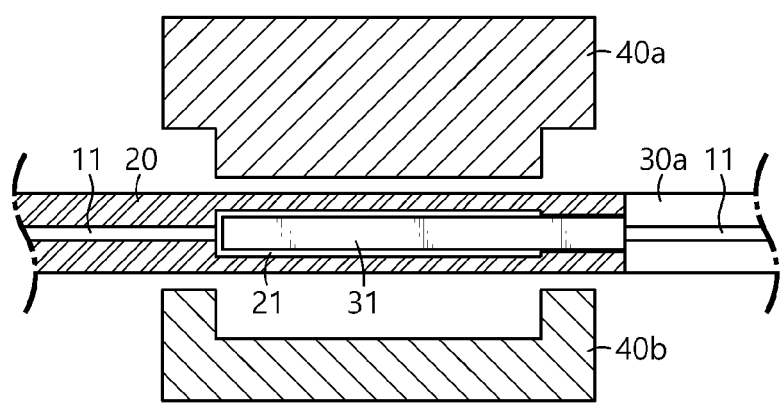
FIG. 8 is a diagram for illustrating a compressing method of connector pins of FIG. 7, as a reference.

For example, as shown in FIG. 8, after the second connector terminal 31 is fitted into the first connector terminal 21, the fitted portion may be placed between compression jigs 40a, 40b and pressed by the compression jigs 40a, 40b such that the first connector terminal 21 and the second connector terminal 31 are compressed integrally. The main FPCB 20 and the sub FPCBs 30a, 30b connected in this way are not easily disconnected even though a tensile strength is applied thereto.

In addition, a film in a region of the main FPCB 20 of this embodiment to which the first connector terminals 21 are provided is formed concave, and a film in a region of the sub FPCBs 30a, 30b to which the second connector terminals 31 are provided is formed convex. If the region to which the first connector terminals 21 of the main FPCB 20 is defined as a concave portion 23 and the region to which the second connector terminals 31 of the sub FPCB 30a, 30b are provided is defined as a convex portion 33, the concave portion 23 and the convex portion 33 may be provided to be engaged with each other.

In this case, if the convex portions 33 of the sub FPCBs 30a, 30b are aligned with the concave portions 23 of the main FPCB 20 and then pushed therein, the eight first connector terminals 21 and the second connector terminals 31 may be naturally fitted with each other without being distorted from each other. Thus, the main FPCB 20 and the sub FPCBs 30a, 30b may be easily assembled without damaging the connector terminals.

Next, a method of manufacturing the above FPCB assembly 10 will be briefly described.

The method of manufacturing the FPCB assembly 10 includes a FPCB component preparing step and a FPCB assembling step.

Figure 9:
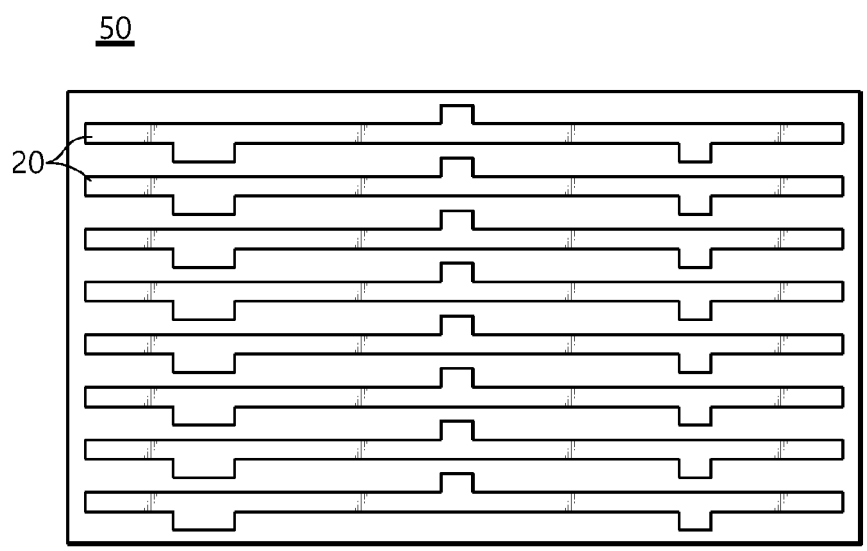
FIGS. 9 and 10 are diagrams for illustrating space utilization of a FPCB sheet when the FPCB for a battery module according to an embodiment of the present disclosure is manufactured, as a reference.
Figure 10:
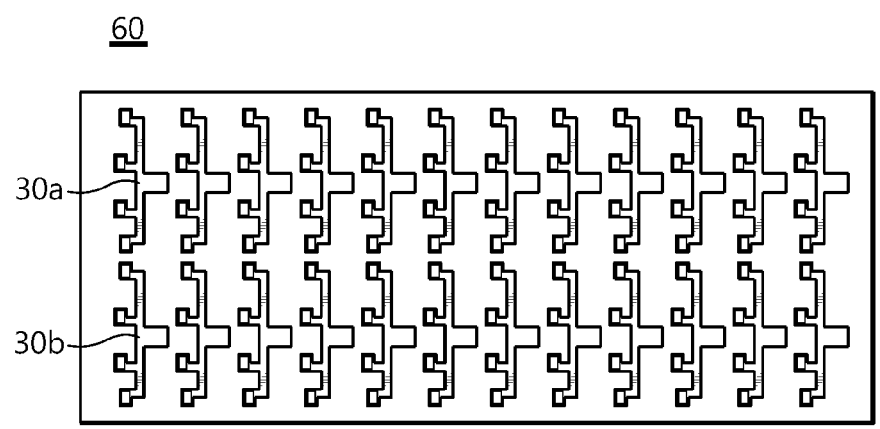

As shown in FIGS. 8 and 9, the main FPCBs 20 are designed in the same pattern in a first FPCB sheet 50, and the sub-FPCBs 30a, 30b are designed in the same pattern in a second FPCB sheet 60 similarly. In this case, the main FPCBs 20 and the sub FPCBs 30a, 30b may be designed approximately in a straight line form so that the areas of the first FPCB sheet 50 and the second FPCB sheet 60 are used to the maximum, thereby minimizing the amount of scrap discarded.

The main FPCBs 20 and the sub FPCBs 30a, 30b are cut off from the first FPCB sheet 50 and the second FPCB sheet 60 according to their shapes, respectively, to prepare FPCB components, and then the FPCB assembling step is performed.

The FPCB assembling step is very simple. First, the second connector terminals 31 provided to one side of the sub FPCBs 30a, 30b are inserted into the first connector terminals 21 provided to both ends of the main FPCB 20 to form the shape of the FPCB assembly 10. Here, as described above, the first connector terminals 21 may be provided to have a form of a socket-type female connector pin, and the second connector terminals 31 may be provided to have a shape of a rod-type male connector pin that may be inserted into the female connector pin.

After that, the first connector terminals 21 and the second connector terminals 31 are integrally compressed using a clinching process. As shown in FIG. 8, the clinching process may be performed in a way that the compression jigs press a region where the first connector terminals 21 and the second connector terminals 31 are connected. According to the clinching process, the main FPCB 20 and the sub FPCBs 30a, 30b are firmly fixed to each other so that the main FPCB 20 and the sub FPCBs 30a, 30b are not easily disconnected even though a tensile force is applied thereto to some extent.

According to the method of manufacturing the FPCB assembly 10 as described above, it is possible to reduce the amount of scrap discarded after manufacturing the FPCB assembly, thereby reducing the material cost. Also, the FPCB assembly for a battery module having an I shape, a T shape, an E shape, an F shape or the like may be simply manufactured by selectively combining several FPCBs having a simple shape.

Meanwhile, a battery module according to the present disclosure may be configured to include the FPCB assembly 10 described above. The FPCB assembly 10 may be used to sense the voltage of battery cells included in the battery module. In addition to the FPCB assembly 10, the battery module may further include a cell stack 100 formed by stacking a plurality of pouch-type battery cells, ICBs 110, 120 for electrically connecting the battery cells, a module case (not shown) for accommodating the battery cells, and other control devices such as a fuse, a relay and a BMS for controlling the charge/discharge and current flow of the battery cells based on the voltage and temperature of the battery cells.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, even though the terms expressing directions such as "upper", "lower", "left" and "right" are used in the specification, they are just for convenience of description and can be expressed differently depending on the location of a viewer or a subject, as apparent to those skilled in the art.

What is claimed is:

1. A flexible printed circuit board (FPCB) assembly for a battery module, comprising:
    a main FPCB portion having a first end, a second end, and sides extending longitudinally along a first axis from the first end to the second end; and
    a first sub FPCB portion configured to be affixed to the main FPCB portion along at least one of the sides of the main FPCB portion such that the first sub FPCB portion extends longitudinally along a second axis that is different from the first axis,
    wherein each of the main FPCB portion and the first sub FPCB portion includes:
        an insulated flexible film;
        conductor patterns arranged inside the film in a predetermined form and configured to transmit an electric signal,
    wherein the main FPCB portion includes first connector terminals attached to the corresponding conductor patterns and positioned along a first side of the main FPCB portion,
    wherein the first sub FPCB portion includes second connector terminals attached to the corresponding conductor patterns and positioned at a region of the first sub FPCB portion that is configured to be affixed to the first side of the main FPCB,
    wherein the second connector terminals are configured to connect to the first connector terminals,
    wherein the first connector terminals and the second connector terminals are compressed by clinching process when connected to each other so that the main FPCB and the first sub FPCB are fixed to each other,
    wherein a first insulated flexible film in a region of the main FPCB portion including the first connector terminals has a concave portion, and
    wherein a second insulated flexible film in a region of the first sub FPCB portion including the second connector terminals has a convex portion which is provided to be engaged with the concave portion.

2. The FPCB assembly according to claim 1,
    further comprising a second sub FPCB portion,
    configured to be affixed to the main FPCB portion.

3. The FPCB assembly according to claim 2,
    wherein the first sub FPCB portion and the second sub FPCB portion are configured to be affixed to opposing sides of the main FPCB portion such that each of the first sub FPCB portion and the second sub FPCB portion extends longitudinally along the second axis.

4. The FPCB assembly according to claim 3,
    wherein at least one voltage sensing terminal is formed on each of the first sub FPCB portion and the second sub FPCB portion, and wherein at least one temperature sensor is formed on the main FPCB portion.

5. A battery module, comprising the FPCB assembly according to claim 1.

6. The FPCB assembly according to claim 1,
    wherein each of the first connector terminals is shaped as a socket-type female connector pin, and wherein each of the second connector terminals is shaped as a male connector pin that is inserted into the female connector pin.

7. The FPCB assembly according to claim 1, wherein the insulated flexible film comprises:
    a base film, wherein the conductor patterns are formed on the base film in the predetermined form; and
    a cover film bonded to the base film to insulate the conductor patterns.

8. The FPCB assembly according to claim 1, wherein the first sub FPCB is configured to be affixed to the main FPCB at a connection point at an edge of at least one of the sides of the main FPCB such that the first sub FPCB extends longitudinally along a second axis that is different from the first axis.

9. A method of manufacturing an FPCB assembly for a battery module comprising an insulated flexible film and conductor patterns arranged inside the film in a predetermined form and configured to transmit an electric signal, the method comprising:
    separating a main FPCB portion of the FPCB assembly on a first FPCB sheet including a plurality of main FPCB portions, wherein the main FPCB portion includes a first end, a second end, sides extending longitudinally along a first axis from the first end to the second end, first connector terminals attached to the corresponding conductor patterns and positioned along a first side of the main FPCB portion, and a first insulated flexible film in a region of the main FPCB portion including the first connector terminals, the first insulated flexible film having a concave portion;
    separating a sub FPCB portion of the FPCB assembly on a second FPCB sheet including a plurality of sub FPCB portions, wherein the sub FPCB portion includes second connector terminals attached to the corresponding conductor patterns and positioned at a region of the first sub FPCB portion that is configured to be affixed to the first side of the main FPCB and a second insulated flexible film in a region of the first sub FPCB portion including the second connector terminals, the second insulated flexible film having a convex portion which is provided to be engaged with the concave portion; and affixing the sub FPCB portion to the main FPCB portion along at least one of the sides of the main FPCB portion such that the first sub FPCB portion extends longitudinally along a second axis that is different from the first axis, wherein the affixing comprises:

connecting the first connector terminals to the second connector terminals; and compressing the first connector terminals and the second connector terminals by a clinching process so that the main FPCB and the first sub FPCB are fixed to each other.

* * * * *